(12) United States Patent
Baiocco et al.

(10) Patent No.: US 7,531,401 B2
(45) Date of Patent: May 12, 2009

(54) METHOD FOR IMPROVED FABRICATION OF A SEMICONDUCTOR USING A STRESS PROXIMITY TECHNIQUE PROCESS

(75) Inventors: Christopher Vincent Baiocco, Newburgh, NY (US); Xiangdong Chen, Poughquag, NY (US); Wenzhi Gao, Singapore (SG); Young Gun Ko, Yongin (KR); Young Way Teh, Singapore (SG)

(73) Assignees: International Business Machines Corporation, Armonk, NY (US); Chartered Semiconductor Manufacturing, Ltd., Singapore (SG); Samsung Electronics Co., Ltd. (KR)

( * ) Notice: Subject to any disclaimer, the term of this patent is extended or adjusted under 35 U.S.C. 154(b) by 183 days.

(21) Appl. No.: 11/672,572

(22) Filed: Feb. 8, 2007

(65) Prior Publication Data
US 2008/0191284 A1 Aug. 14, 2008

(51) Int. Cl.
*H01L 21/8238* (2006.01)

(52) U.S. Cl. ............... 438/199; 438/938; 257/E21.635
(58) Field of Classification Search ......... 438/199–211, 438/938
See application file for complete search history.

(56) References Cited

U.S. PATENT DOCUMENTS

| | | | |
|---|---|---|---|
| 7,285,452 B2 * | 10/2007 | Sadaka et al. ............... 438/198 |
| 2005/0258515 A1 | 11/2005 | Chidambarrao et al. |
| 2005/0260810 A1 | 11/2005 | Cheng et al. |
| 2006/0024879 A1 | 2/2006 | Fu et al. |

\* cited by examiner

*Primary Examiner*—H. Jey Tsai
(74) *Attorney, Agent, or Firm*—Yuanmin Cai; Howard Cohn

(57) ABSTRACT

An improved method for applying stress proximity technique process on a semiconductor device and the improved device is disclosed. In one embodiment, the method utilizes an additional set of sidewall spacers on one or more NFET devices during the fabrication process. This protects the one or more of the NFET devices during the activation of a compressive PFET stress liner, thereby reducing the compressive forces on the one or more NFET devices, and creating a semiconductor device with improved performance.

18 Claims, 11 Drawing Sheets

METHOD FOR IMPROVED FABRICATION OF A SEMICONDUCTOR USING A STRESS PROXIMITY TECHNIQUE PROCESS

FIELD OF THE INVENTION

This invention generally relates to formation of MOSFET devices in integrated circuit manufacturing processes and more particularly to improved techniques for employing a stress proximity technique.

BACKGROUND

As the demands of technology require smaller and more powerful electronic devices, there is a need for semiconductors with increased performance. Since it has become increasingly difficult to improve MOSFETs and therefore complementary metal oxide semiconductor (CMOS) performance through continued scaling, new methods for improving performance without scaling have become critically important.

One approach for improving semiconductor performance is to increase carrier (electron and/or hole) mobilities. Increased carrier mobility can be obtained, for example, by introducing an appropriate strain into the Si lattice of the silicon (Si)-containing substrate that is used to fabricate the semiconductor device into the finished product of an integrated circuit.

The application of stress along the channel changes the lattice dimensions of the silicon (Si)-containing substrate that is used to fabricate the semiconductor device. By changing the lattice dimensions, the band structure and mobility of the material are changed as well. These stresses are induced using a stress film. The stress film is typically a nitride liner, such as $Si_3N_4$. These stress films are known in the semiconductor industry. For example, U.S. published patent application US20050258515 entitled "Embedded Stressed Nitride Liners for CMOS Performance Improvement," which is incorporated in its entirety herein by reference, discloses such a stress film. The stress in applied to a channel can be increased when the stress nitride is moved close to the channel. This technique is generally known in the industry as a "Stress Proximity Technique" (SPT).

Compressive longitudinal stress along the channel of a field effect transistor (FET) increases drive current in p-type field effect transistors (PFET) and decreases drive current in n-type field effect transistors (NFET). Tensile longitudinal stress along the channel of a field effect transistor (FET) increases drive current in NFETs and decreases drive current in PFETs.

One method of executing the SPT involves removing spacers surrounding the gate of the FET in order to bring the stress film closer to the device channel without etching existing films on the device structure. One problem with this method is that devices that are not targeted for SPT also lose their spacers, and are thereby degraded.

Another method is to relax the stress film only on the non-targeted devices. However, this requires an additional lithography level and implant process. Furthermore, it is difficult to completely relax the stress film. Furthermore, due to the non-uniform nature of the stress film (where it is thinner on surfaces parallel to the direction of deposition, and thicker on surfaces perpendicular to the direction of deposition), the relaxing species can easily penetrate the film where protection is most needed, thereby degrading the semiconductor device.

Therefore, what is needed is an improved method for efficiently executing an SPT process, without adding undue manufacturing complexity.

SUMMARY OF THE INVENTION

According to the present invention, there is disclosed an integrated circuit comprising a plurality of n-type field-effect-transistor (NFET) and p-type field-effect-transistor (PFET) devices disposed upon a semiconductor substrate. One or more of the PFET devices have a first set of sidewall spacers on either side of a first gate electrode. One or more of the NFET devices having a first set of sidewall spacers on either side of a second gate electrode and a second set of sidewall spacers disposed against the first set of sidewall spacers on an opposite side away from the second gate electrode. A compressive stress layer comprised of a nitride liner covers one or more of the plurality of NFET and PFET devices whereby: the compressive stress layer over the one or more NFET devices are implanted with a relaxation species for relaxing the compressive stress over the one or more NFET devices; and the compressive stress layer over the one or more PFET devices are substantially free of the relaxation species. The relaxation species is selected from the group of material consisting of Xenon and Germanium.

Also, according to the present invention, a method of applying a stress proximity technique process comprises the following steps. A semiconductor device is formed comprising a semiconductor substrate having a plurality of NFET and PFET devices disposed thereon. At least one of the NFET devices and at least one of the PFET devices having a first set of sidewall spacers and a second set of sidewall spacers, respectively. An oxide liner is disposed over the at least one of the NFET devices and the at least one of the PFET devices. A tensile stress layer is deposited over the at least one of the NFET devices and the at least one of the PFET devices. At least a portion of the tensile stress layer is removed over the at least one of the PFET devices. At least a portion of the tensile stress layer is selectively removed over the at least one of the NFET devices, thereby forming a third set of sidewall spacers on the at least one of the NFET devices. The second set of sidewall spacers are selectively removed the from the at least one of the PFET devices and the third set of sidewall spacers from the at least one of the NFET devices with the second set of sidewall spacers of the at least one of the NFET devices remaining substantially intact.

Further according to the present invention, a compressive stress layer is deposited over the at least one of the NFET devices and the at least one of the PFET devices after selectively removing the second set of sidewall spacers from the at least one of the PFET devices and the third set of sidewall spacers from the at least one of the NFET devices. Then the compressive stress layer is relaxed over the at least one of the NFET devices to reduce the compressive forces on the at least one of the NFET devices.

Still further according to the present invention, a non-uniform nitride layer is applied over the semiconductor device after the step of selectively removing at least a portion of the tensile stress layer from the at least one of the NFET devices, whereby the non-uniform nitride layer is removed during the step of removing the second set of sidewall spacers from the at least one of the PFET devices and the third set of sidewall spacers from the at least one of the NFET devices. The non-uniform nitride layer comprises a non-uniform nitride material across the semiconductor device.

Yet further according to the present invention, the application of a non-uniform nitride material creates a profile where the nitride material is thicker on the upper portions of the profile across the at least one of the NFET devices and the at least one of the PFET devices and thicker along the bottom portions of the profile between the at least one of the NFET devices and the at least one of the PFET devices and thinner in the middle of the profile adjacent the sidewall portions of the at least one of the NFET devices and the at least one of the PFET devices. The non-uniform nitride material has a profile that has a thickness ranging from about 500 Angstroms to about 750 Angstroms.

Also according to the present invention, the non-uniform nitride layer is removed with an isotropic etch process.

Still further according to the present invention, the step of relaxing the compressive stress comprises implanting the compressive stress layer with a relaxation species. The relaxation species is a material comprised of Xenon or Germanium.

Also according to the present invention, depositing a compressive stress layer comprises depositing a nitride liner material having a compressive internal stress state. The deposition of the compressive stress layer is performed by plasma enhanced chemical vapor deposition.

Yet further according to the present invention, the deposition of a tensile stress layer comprises depositing a nitride liner material having a tensile internal stress state. The deposition of the tensile stress layer is performed by plasma enhanced chemical vapor deposition.

According to the present invention, the semiconductor device is thermal cycled after removing at least a portion of the tensile stress layer over the at least one of the PFET devices to activate the tensile stress layer over the at least one of the NFET devices and induce a stress within the at least one of the NFET devices. The thermal cycling comprises performing a standard dopant activation anneal with a temperature in excess of about 1070 degrees Centigrade.

Also according to the present invention, an anisotropic reactive ion etch is used for removing at least a portion of the tensile stress layer from the at least one of the NFET devices.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
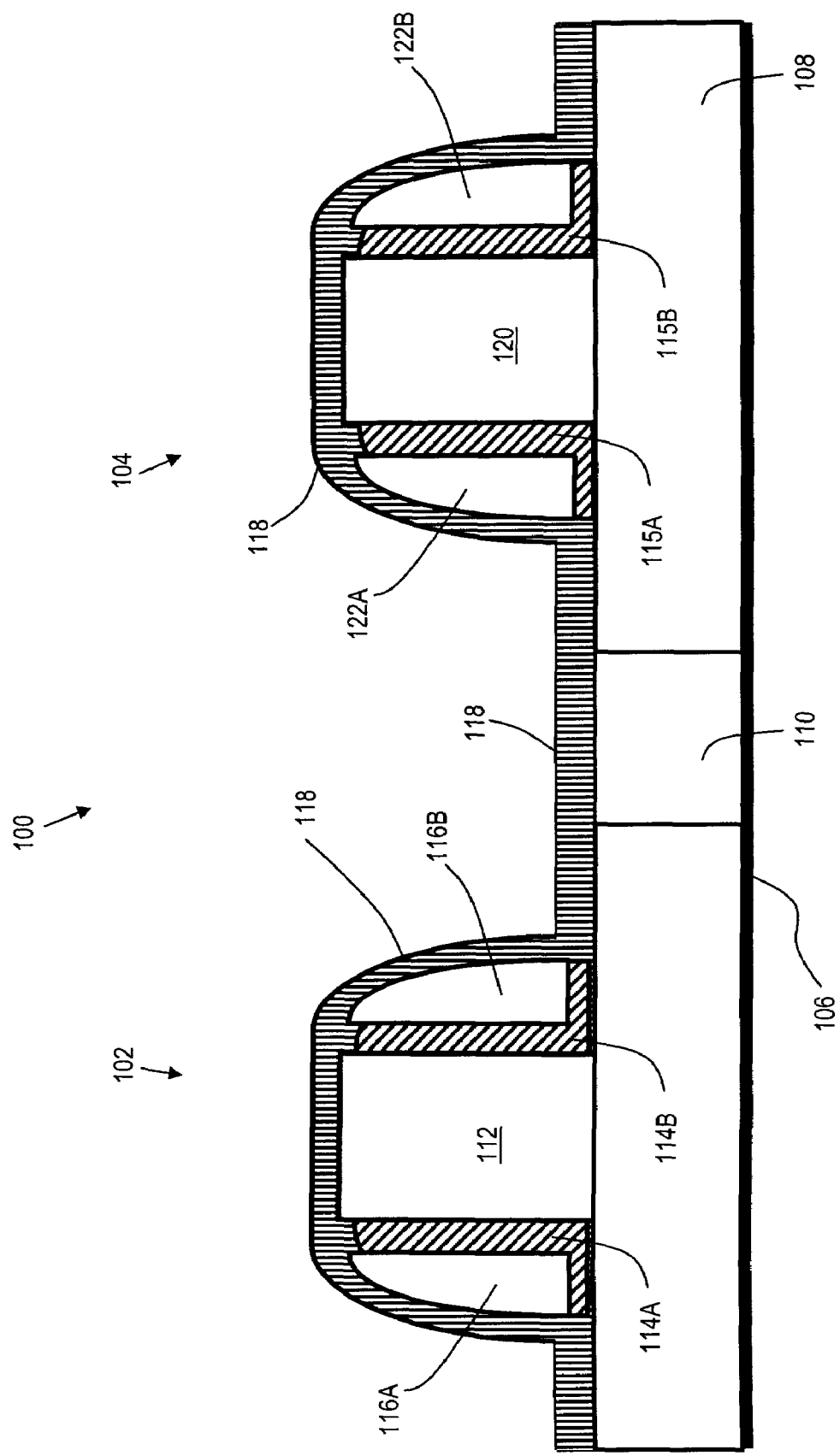

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIG. 1 shows a cross sectional view of an exemplary prior art circuit on which the method of the present invention can be applied.

FIGS. 2-10 show a cross sectional view of an exemplary integrated circuit during the various steps of the method of the present invention.

DETAILED DESCRIPTION

Exemplary embodiments of the invention are described below. In the interest of clarity, not all features of an actual implementation are described in this specification. It will of course be appreciated that while the methods disclosed herein might be considered complex and time-consuming, they are able to be understood by those of ordinary skill in the art.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 shows a cross-sectional view of a prior art integrated circuit 100, prior to performing the steps of the present invention. For illustrative purposes, two types of field effect transistor are shown; of n-type field-effect-transistor (NFET) 102 and p-type field-effect-transistor (PFET) 104. Throughout the description of the present invention one NFET and PFET devices are described. It is understood, however, that one or more of each device can be processed according to the present invention. The integrated circuit 100 is comprised of substrate 106, which may represent any appropriate substrate for the formation of integrated circuits, such as a silicon substrate, a silicon-on-insulator (SOI) substrate, any other semiconductor substrate or insulating substrate having formed thereon a substantially crystalline semiconductor layer 108.

As shown in FIG. 1, one or more NFETs 102 and PFETs 104 can be separated by a shallow trench isolation (STI) structure 110, which defines a transistor active region in the semiconductor layer 108. Within NFET 102, a gate electrode 112 is formed above the semiconductor layer 108. A similar gate electrode 120 is formed within PFET 104. Within NFET 102, the gate electrode 112 is in between sidewall spacers (114A and 114B) formed from an oxide liner, and by sidewall spacers 116A and 116B. Sidewall spacers 116A and 116B are referred to as "spacer-2" spacers. Within PFET 104, the gate electrode 120 is in between sidewall spacers (115A and 115B) that are formed from an oxide liner, and sidewall spacers 122A and 122B. Gate electrodes 112 and 120 have silicide region 117C at the top thereof. Silicidation is a well-known process in the semiconductor industry. The process comprises depositing a metal, and performing thermal cycling so the metal reacts with the silicon that is in contact with the metal. Some examples of commonly used metals are cobalt, nickel, titanium, and tungsten. The silicide serves to improve the performance of a semiconductor device. A second oxide liner 118 covers at least NFET 102 and PFET 104 of integrated circuit 100.

It should clearly be understood that FIG. 1 illustrates but an extremely small (microscopic) portion of an integrated circuit (IC) device, let alone a semiconductor wafer comprising a large plurality of such devices. For example, what is shown may have a width of only a few microns (pm) of a semiconductor wafer having a diameter of several inches. Also, in "real life" things are not so neat and clean, rectilinear and uniform as shown. However, for one of ordinary skill in the art to which the invention most nearly pertains, this and other figures presented in this patent application will be very useful, when taken in context of the associated descriptive text, for understanding the invention.

The semiconductor device or integrated circuit device 100 shown in FIG. 1 (as well as in the other Figures) is generally fabricated utilizing conventional processing steps well known to those skilled in the art. Except for the processing steps of the present invention, such processing steps and techniques are well known and are not critical for understanding the present invention. Therefore a detailed discussion of these well known steps is not given herein. It will be understood that various steps and materials have been omitted, for illustrative clarity, such as seed layers, adhesion layers, cleaning steps and the like.

Figure 2:
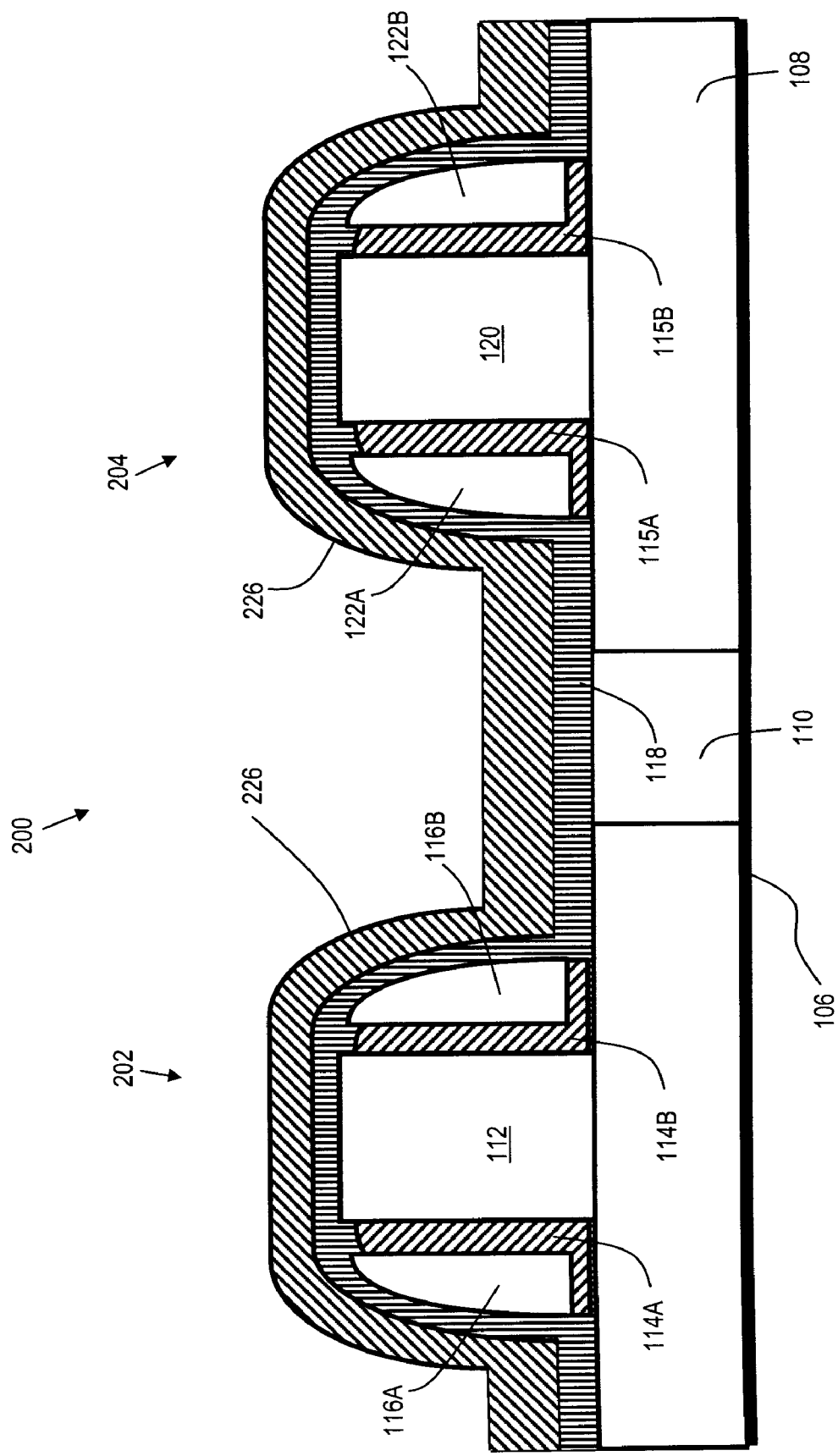

FIG. 2 shows a cross-sectional view of an integrated circuit 200 (incorporating the integrated circuit 100 in FIG. 1), after performing the first step of the present invention. In this step, a tensile stress layer 226 (also referred to as a nitride liner) is deposited on both NFET 202, and PFET 204. Throughout the specification, it is understood that there are a plurality of NFET and PFET devices disposed on the semiconductor substrate of the integrated circuit 200. Each of the steps described herein occurs on at least one of the NFET devices and on at least one of the PFET devices. The tensile stress layer 226 is applied for the benefit of NFET 202, and is counterproductive for PFET 204. This is because compressive stress increases drive current in p-type field effect transistors (PFET) and decreases drive current in n-type field effect transistors (NFET). Tensile stress increases drive current in NFETs and decreases drive current in PFETs. Therefore, the tensile stress layer 226 must be removed from PFET 204, as will be illustrated in upcoming steps.

Note that in each figure, reference numbers x02 and x04 are generally similar, with the possible addition of removal of some material. For example, NFET device 202 of FIG. 2 is the same device as NFET device 102 of FIG. 1, with the addition of material, namely, tensile stress layer 226.

Figure 3:
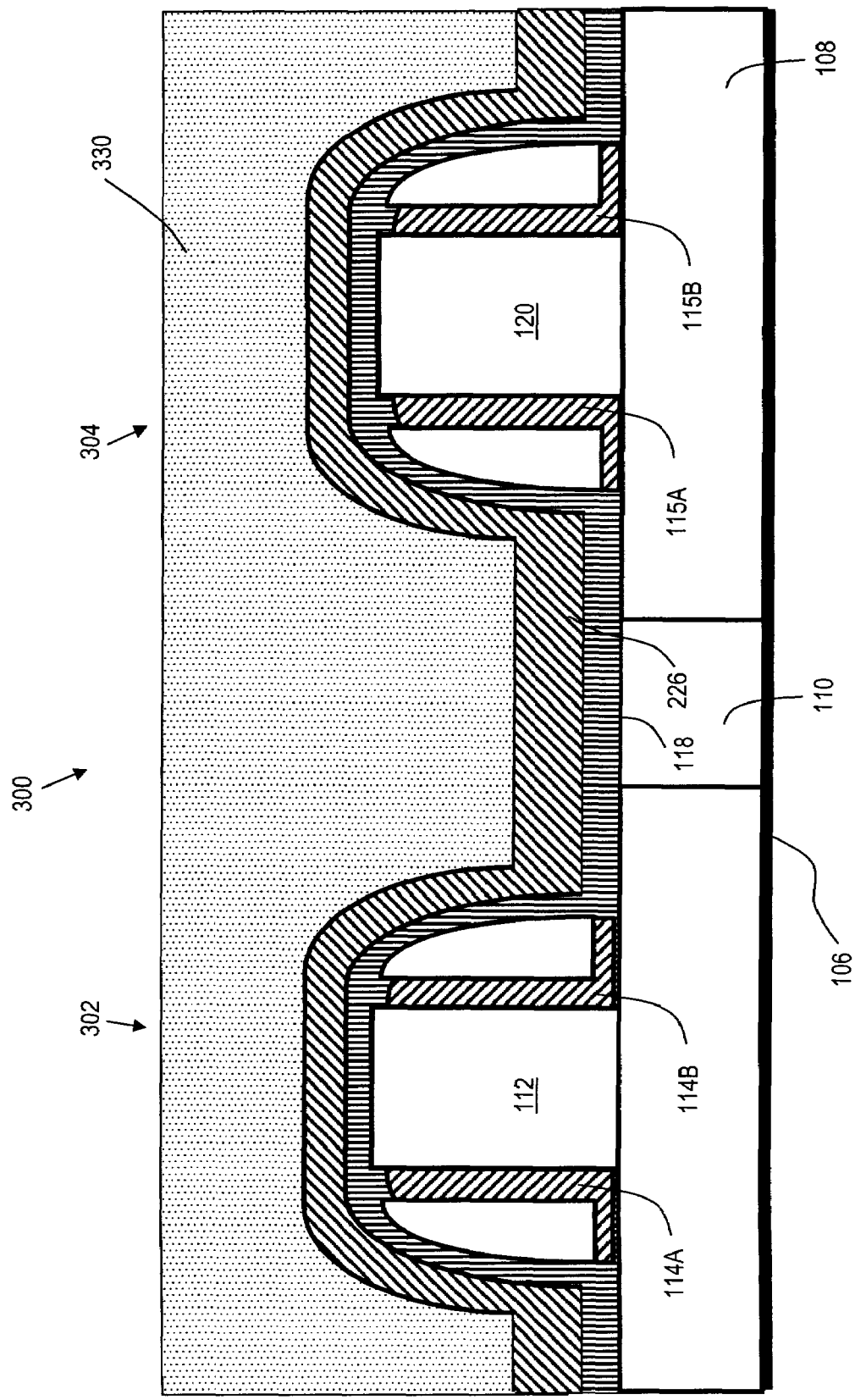

FIG. 3 shows a cross-sectional view of an integrated circuit 300 (incorporating the integrated circuit 200 in FIG. 2), after performing a subsequent step of the present invention. In this step, a photoresist 330 is applied over top of NFET 302 and PFET 304 of integrated circuit 300.

Figure 4:
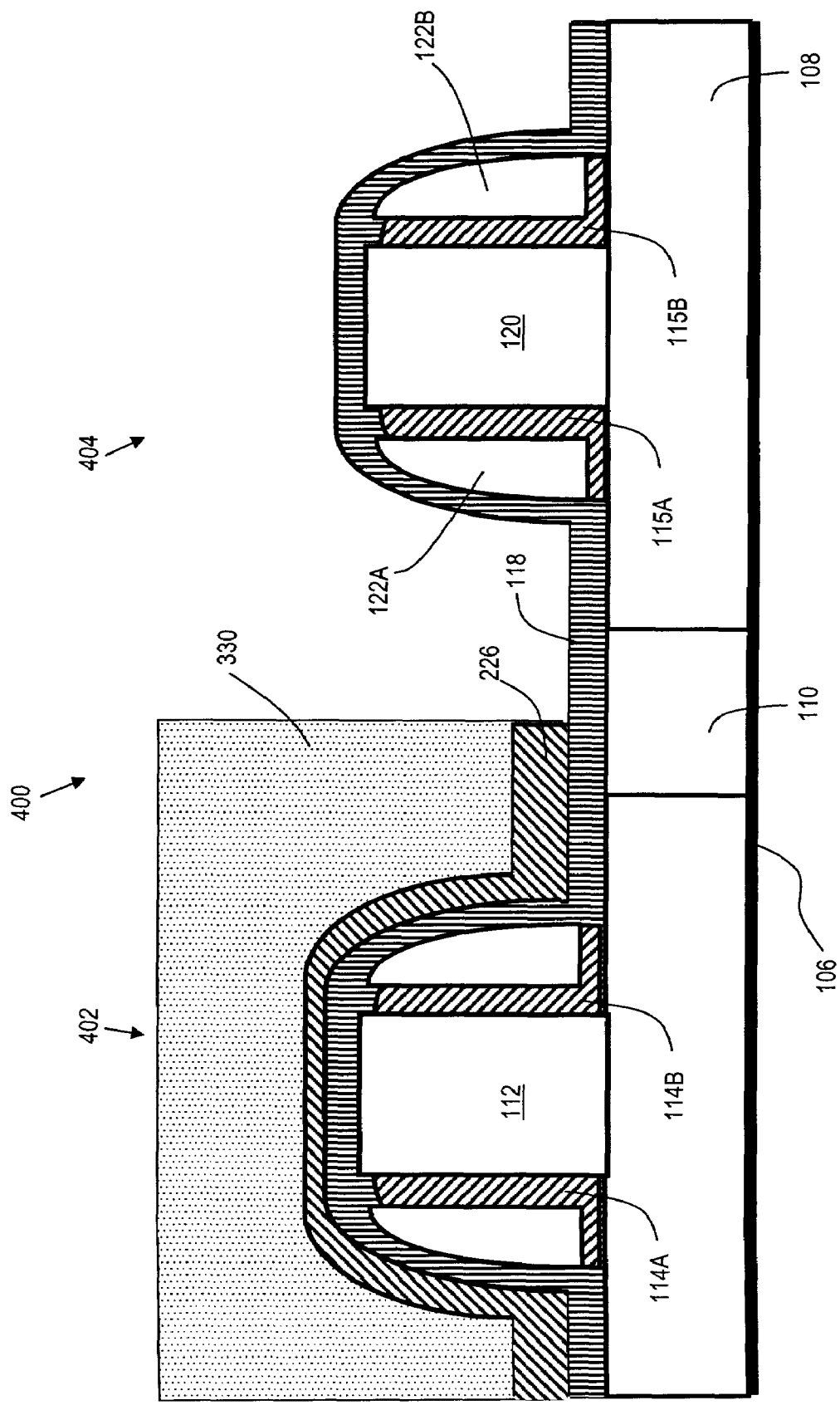

FIG. 4 shows a cross-sectional view of an integrated circuit 400 (incorporating the integrated circuit 300 in FIG. 3), after performing a subsequent step of the present invention. In this step, the photoresist 330 and tensile stress layer 226 are removed from PFET 404 and partly above shallow trench isolation (STI) structure 110 using standard methods known in the industry. For example, the photoresist 330 is typically removed using standard lithographic methods. The tensile stress layer 226 may be removed via known etch techniques.

Next, integrated circuit 400, as shown in FIG. 4, is subject to thermal cycling to activate dopants (not shown) within the semiconductor. The thermal cycling preferably comprises a standard dopant activation anneal, with a temperature in excess of 1,070 degrees Centigrade. This step also induces a stress within NFET 402. The amount of stress varies depending on the application, but is typically in the range of about 500 to about 2,000 (MPa). When the tensile stress layer 226 is later removed, as discussed hereinafter, the stress it induced remains in NFET 402.

Figure 5:
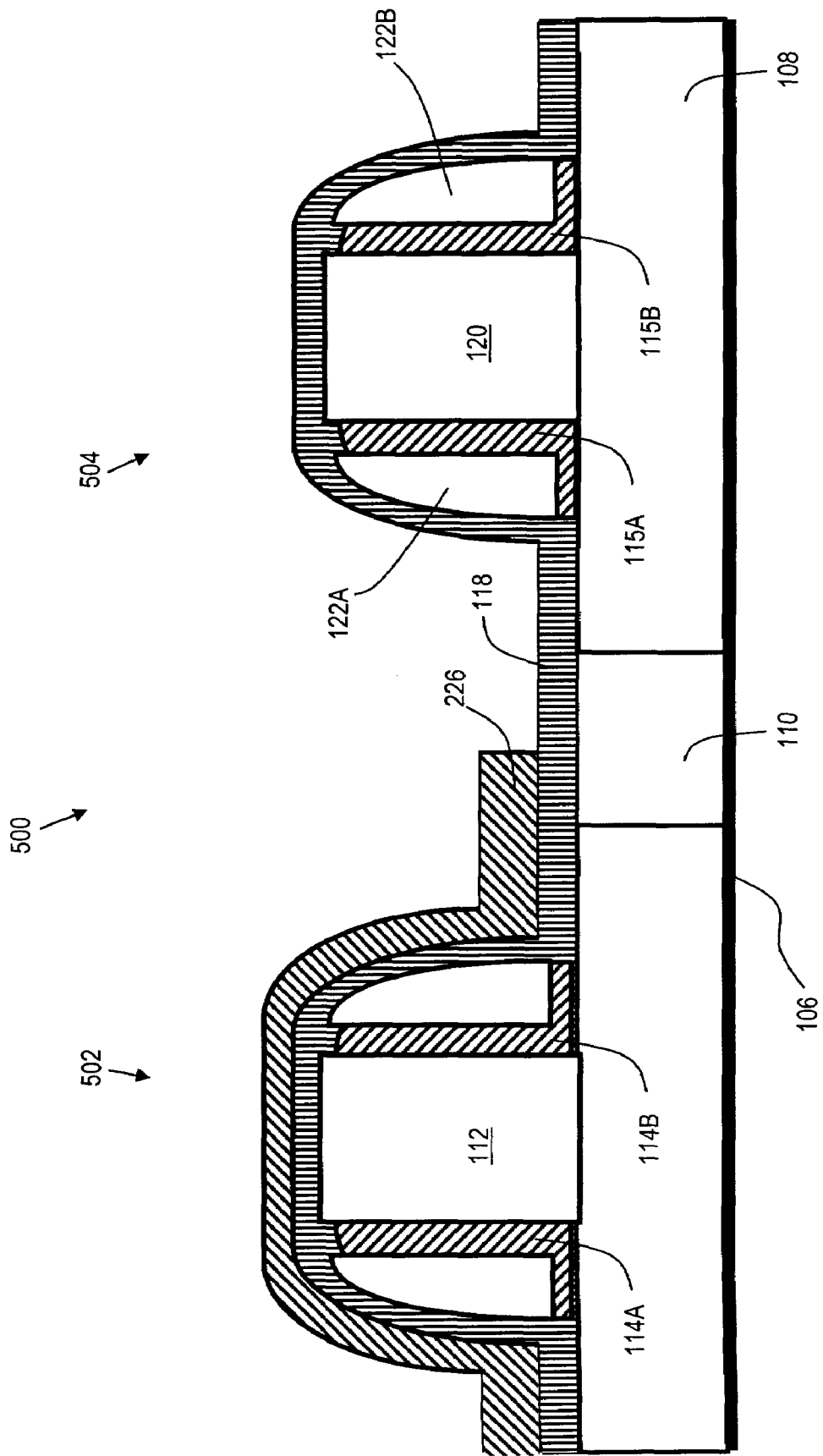

FIG. 5 shows a cross-sectional view of an integrated circuit 500 (incorporating the integrated circuit 400 in FIG. 4), after performing a subsequent step of the present invention. In this step, the photoresist 330 is removed from NFET 502 using well known methods, such as standard lithographic methods.

Figure 6A:
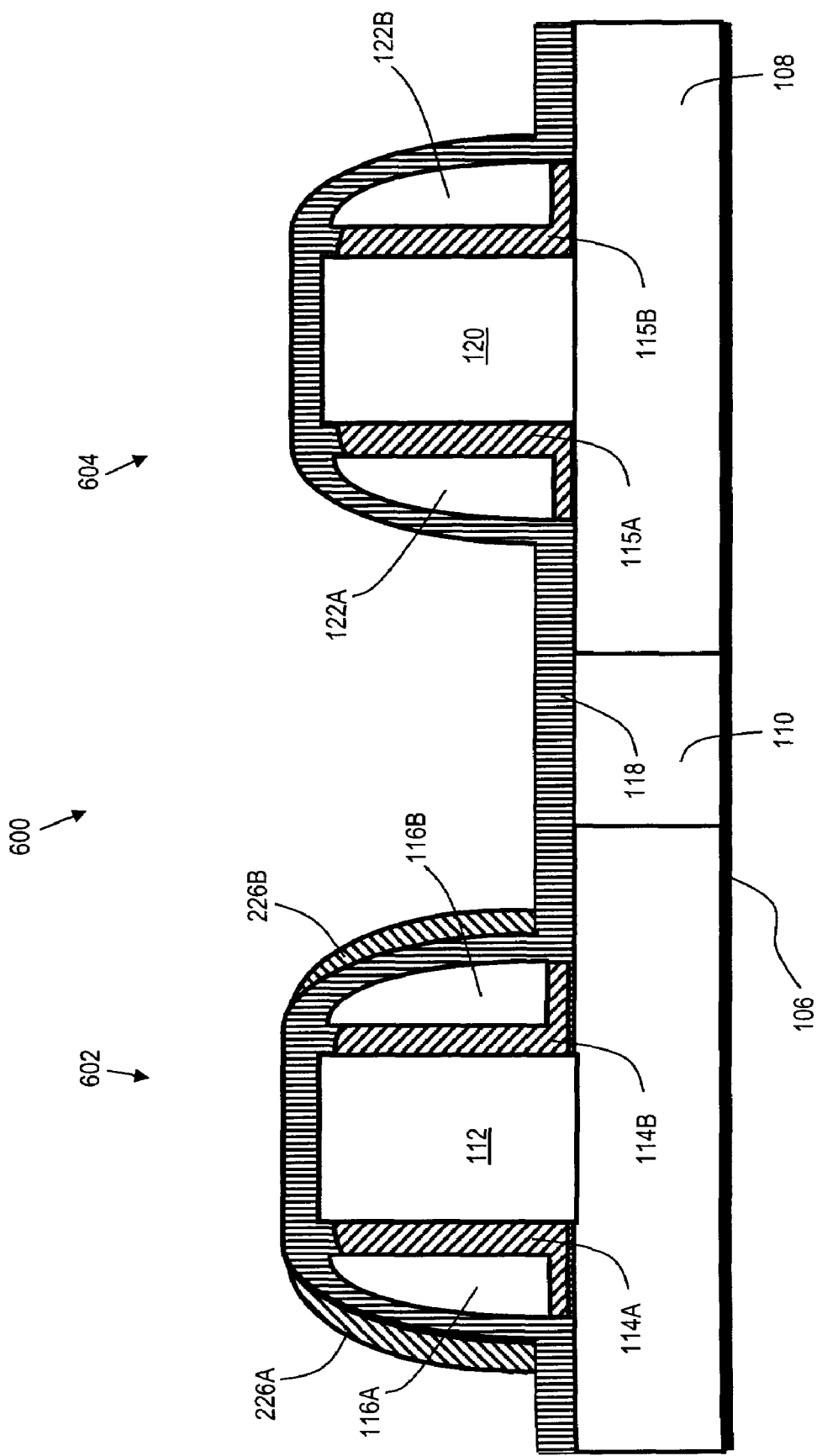

FIG. 6A shows a cross-sectional view of an integrated circuit 600 (incorporating the integrated circuit 500 in FIG. 5), after performing a subsequent step of the present invention. In this step, with oxide liner 118 covering and protecting PFET device 504, a portion of the tensile stress layer 226 is selectively removed from NFET 602, for example, by anisotropic etching. In particular, the tensile stress layer 226 is removed from the top surface of NFET device 602 (compare NFET device 502 of FIG. 5). The remaining portion of tensile stress layer 226 forms additional sidewall spacers 226A and 226B. Note that the spacers 226A and 226B are thinner near the upper surface of NFET 602 because they are subject to an anisotropic etch. Spacers 226A and 226B are referred to as "spacer-3" spacers. This step is in marked comparison to the technique of the prior art, in which the tensile stress layer 226 would be completely removed. The technique used to remove tensile stress layer 226 is preferably an anisotropic reactive ion etch (RIE) because RIE achieves anisotropic profiles, and enables fast etch rates.

Figure 6B:
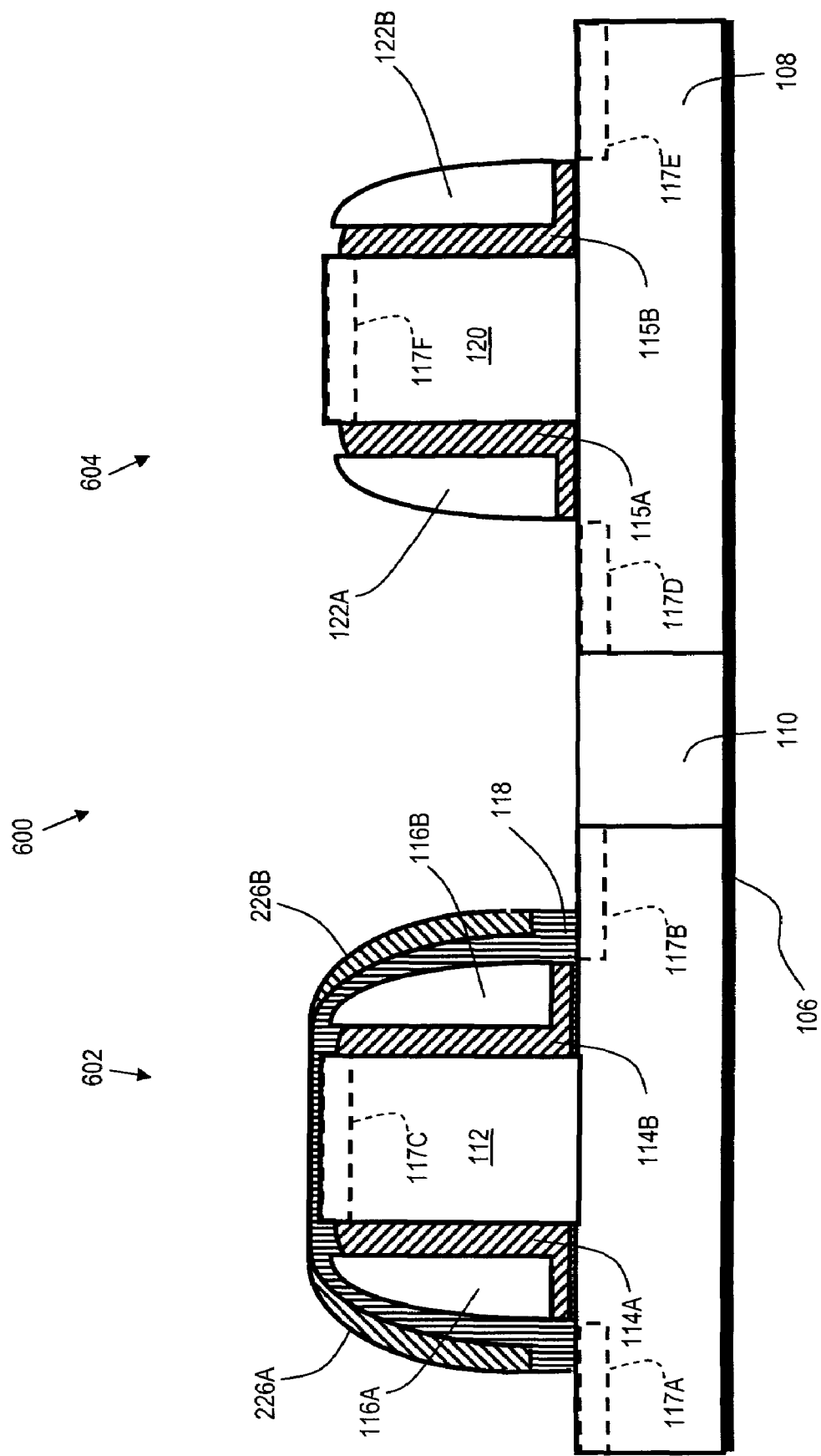

FIG. 6B shows subsequent processing steps performed on integrated circuit 600. First, oxide liner 118 is removed from most of the integrated circuit 600. The oxide liner 118 is typically removed as part of a standard pre-clean process that occurs prior to silicide deposition. Subsequent to the pre-clean process, the oxide liner 118 remains between spacers 116A and 116B, and spacers 226A and 226B, and covers gate electrode 112, as shown in FIG. 6B. Next, silicide areas 117A, 117B, and 117C are formed on NFET 602 and silicide areas 117D, 117E, and 117F are formed on PFET 604. The silicide areas are formed via standard deposition methods that are well known in the art. Note that while the illustrated examples show silicide deposition before the spacer removal, it is possible to perform silicide deposition after spacer removal, without departing form the scope of the present invention.

Figure 7:
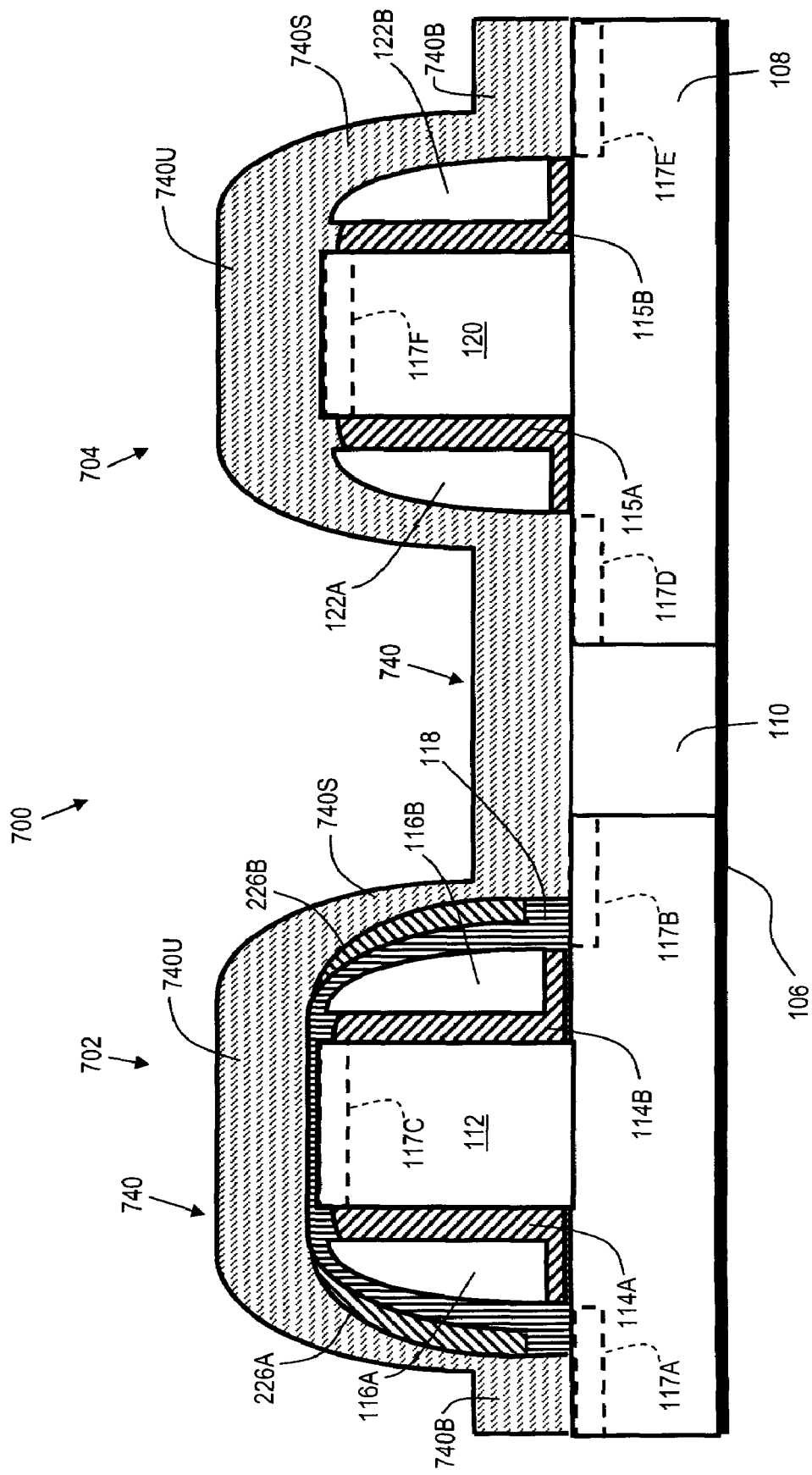

FIG. 7 shows a cross-sectional view of an integrated circuit 700 (incorporating the integrated circuit 600 in FIG. 6), after performing a subsequent step of the present invention. As part of the overall semiconductor processing, it is necessary to apply compressive stress to PFET 704. The compressive stress is more beneficial to the PFET device performance when spacers 122A and 122B are removed prior to applying a compressive stress film. However, removing the spacers 122A and 122B via an etch process can compromise silicide regions 117A-117F. To provide additional protection for silicide regions 117A-117F, a non-uniform nitride layer 740 is deposited onto NFET 702 and PFET 704 of integrated circuit 700. The nature of the non-uniform nitride material is that it has a profile which is thick on the upper portions 740U and the bottom portions 740B, but thinner on the sidewall portions 740S. The thick bottom portions 740B of the non-uniform nitride layer 740 protects the silicide regions 117A-117C of NFET 702 and 117D-117F of PFET 704 during an upcoming etch cycle.

During that etch cycle, the thinner sidewall portions 740S, being thinner, are etched away first, followed by the spacers (226A, 226B, and 122A, 122B). The thicker portions (740U and 740B) require more time to etch away, thereby providing additional protection to silicide regions 117A-117F. The non-uniform nitride layer 740 typically has a thickness ranging from about 500 Angstroms to about 750 Angstroms. Note that a primary purpose of non-uniform nitride layer 740 is to protect silicide regions 117A-117F. However, as was noted previously, there is flexibility as to where in the sequence of processing steps that the silicide regions 117A-117F are applied. If they are applied after the removal of spacers 116A and 116B, than the non-uniform nitride liner would not provide much benefit, and this step could be skipped, without departing from the scope of the present invention.

Figure 8:
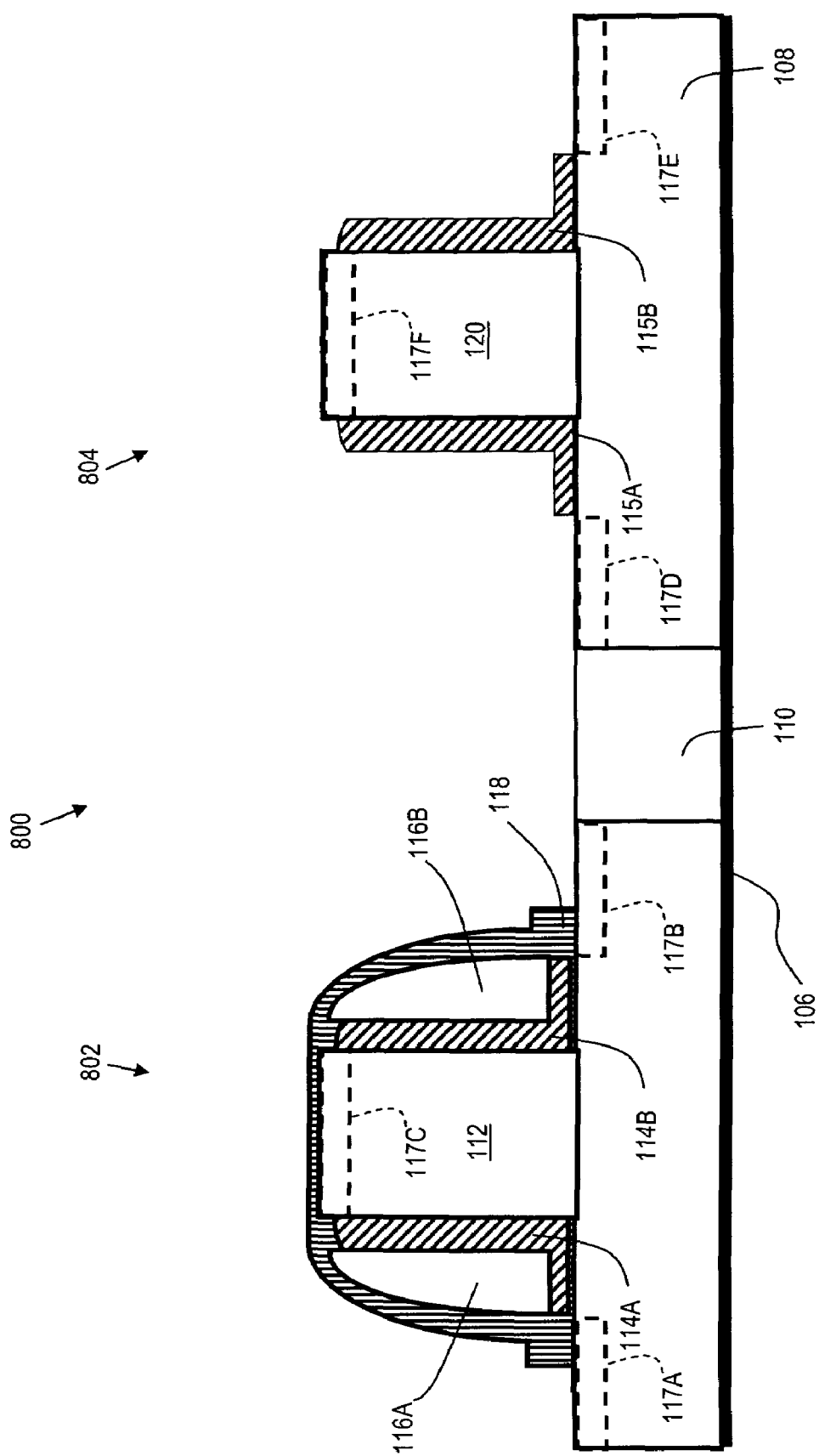

FIG. 8 shows a cross-sectional view of an integrated circuit 800 (incorporating the integrated circuit 700 in FIG. 7), after performing a subsequent step of the present invention. In this step, non-uniform nitride layer 740 is preferably removed via a selective isotropic etch process. Spacers 226A and 226B are also selectively removed from NFET 802 during this etch process. The spacers 226A and 226B provided by the present invention are "sacrificial" spacers that serve to protect spacers 116A and 116B during this processing step. Spacers 116A and 116B are beneficial to have in place during upcoming processing steps. As a result of the present invention, spacers 116A and 116B remain substantially intact, with no significant degradation, since they were protected by the "sacrificial" spacers 226A and 226B. The oxide liner 118 remains in place over NFET 802, and serves as an etch stop to protect spacers 116A and 116B. Oxide liner 118 may optionally be removed in a following processing step, as is illustrated in an upcoming figure. Spacers 122A and 122B are removed from the PFET 804 during this etch process as well. This is important for the compressive stress to have increased benefit for PFET 804.

Figure 9:
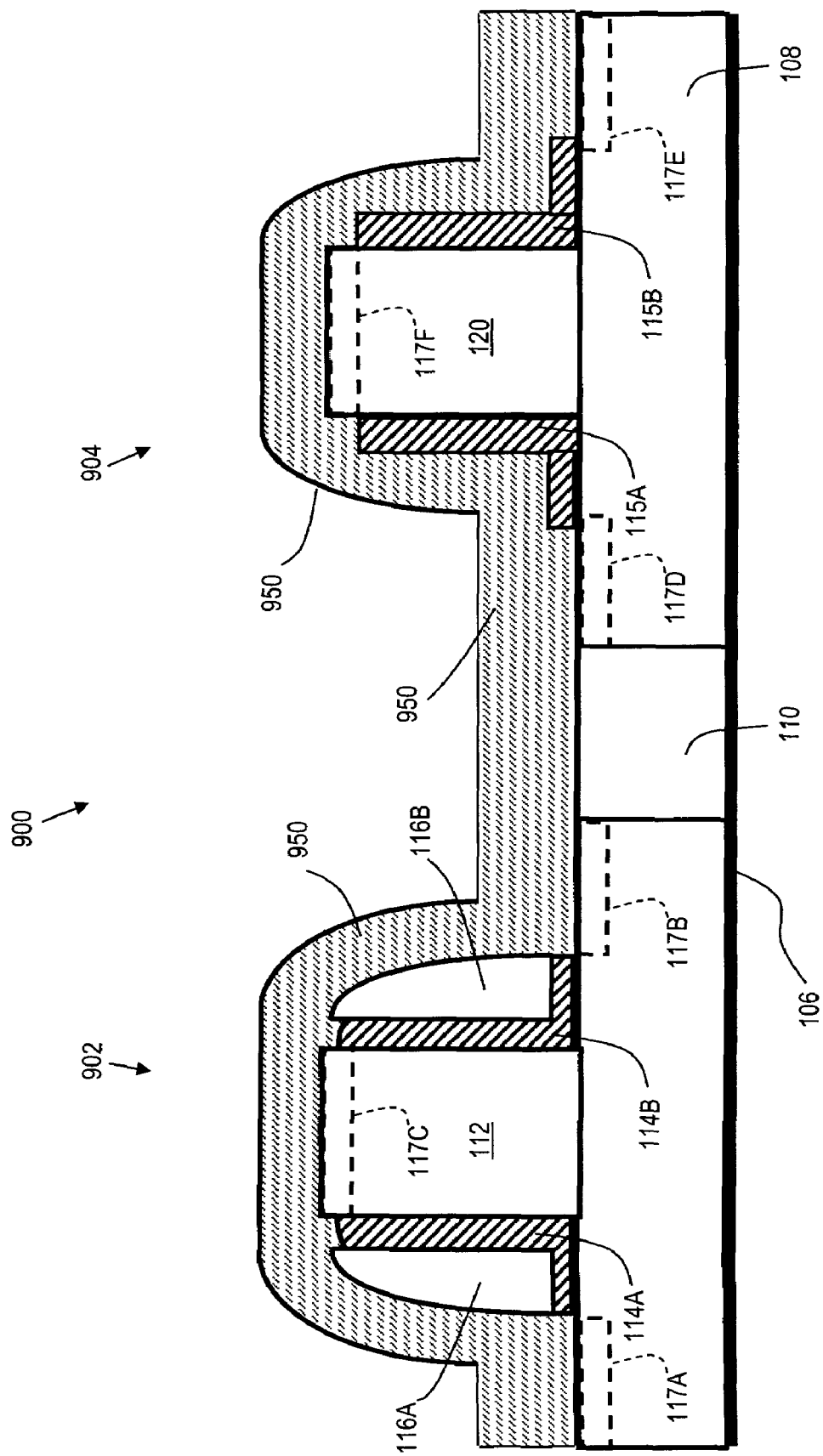

FIG. 9 shows a cross-sectional view of an integrated circuit 900 (incorporating the integrated circuit 800 in FIG. 8), after performing a subsequent step of the present invention. In this step, oxide liner 118 is removed from PFET 902 via an etch process. Next, a compressive stress layer 950 is deposited onto NFET 902 and PFET 904 of integrated circuit 900. The compressive stress layer 950 is typically comprised of a nitride liner material similar to that used in the tensile stress layer 226. Modifying the process conditions of the nitride liner forming method can control whether the state of stress is tensile or compressive. Plasma enhanced chemical vapor deposition (PECVD) can provide nitride liners having a compressive or tensile internal stress. The stress state of the nitride liner deposited by PECVD can be controlled by changing the deposition conditions to alter the reaction rate within the deposition chamber. More specifically, the stress state of the deposited nitride liner may be set by changing the deposition conditions such as: $SiH_4/N_2/He$ gas flow rate, pressure, RF power, and electrode gap.

Figure 10:
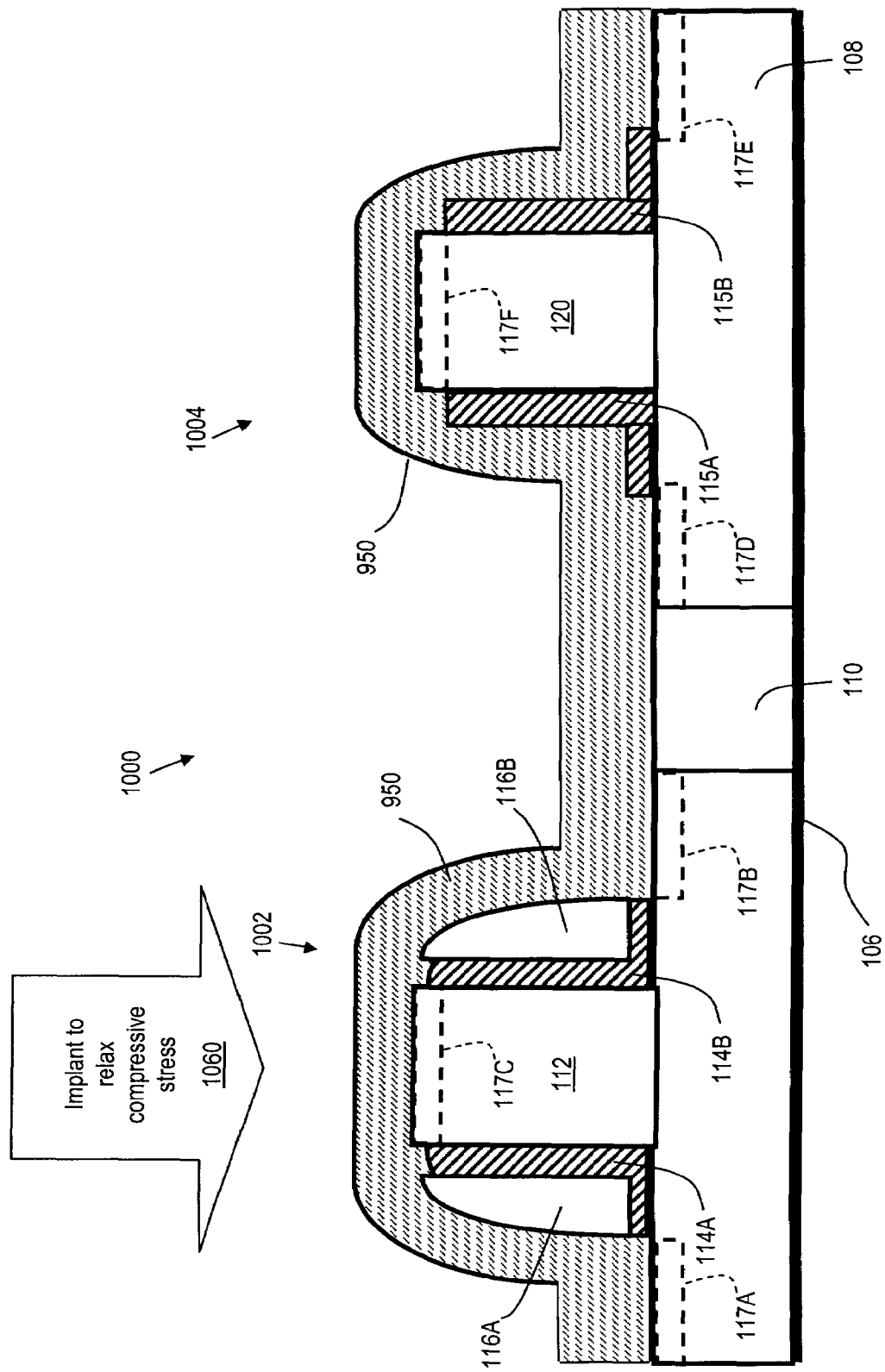

FIG. 10 shows a cross-sectional view of an integrated circuit 1000 (incorporating the integrated circuit 900 in FIG. 9), after performing a subsequent step of the present invention. In this step, compressive stress layer 950 is relaxed over NFET 1002 by implanting compressive stress layer 950 with a relaxation species 1060. No relaxation species is implanted on PFET 1004, since compressive stress is desirable for a PFET device. This step is symbolically indicated via a large arrow above NFET 1002. The relaxation species 1060 is preferably a material such as Xenon or Germanium. Spacers 116A and 116B of NFET 1002 have been preserved throughout the method of the present invention. This protects NFET 1002 during the step of implanting relaxation species 1060. This relaxation step is necessary for NFET 1002 because compressive stress caused by compressive stress layer 950 would degrade performance of NFET 1002 if it were not done.

Once the step of relaxing compressive stress layer 950 is complete, standard semiconductor fabrication techniques known in the art can be used to complete the manufacture of integrated circuit 1000.

As can be seen from the preceding description, the present invention provides improved techniques for employing a stress proximity technique. It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method of applying a stress proximity technique process, the method comprising the steps of:
    forming a semiconductor device, said semiconductor device comprising a semiconductor substrate having a plurality of NFET and PFET devices disposed thereon, at least one of the NFET devices and at least one of the PFET devices having a first set of sidewall spacers and a second set of sidewall spacers, respectively, and an oxide liner disposed over the at least one of the NFET devices and over the at least one of the PFET devices;
    depositing a tensile stress layer over the at least one of the NFET devices and over the at least one of the PFET devices;
    removing at least a portion of the tensile stress layer over the at least one of the PFET devices;
    selectively removing at least a portion of the tensile stress layer over the at least one of the NFET devices, thereby forming a third set of sidewall spacers on the at least one of the NFET devices; and
    selectively removing the second set of sidewall spacers from the at least one of the PFET devices and the third set of sidewall spacers from the at least one of the NFET devices with the second set of sidewall spacers of the at least one of the NFET devices remaining substantially intact.

2. The method of claim 1, further comprising the step of depositing a compressive stress layer over the at least one of the NFET devices and the at least one of the PFET devices after selectively removing the second set of sidewall spacers from the at least one of the PFET devices and the third set of sidewall spacers from the at least one of the NFET devices.

3. The method of claim 2, further comprising the step of relaxing the compressive stress layer over the at least one of the NFET devices to reduce the compressive forces on the at least one of the NFET devices.

4. The method of claim 3, further comprising the step of applying a non-uniform nitride layer over the semiconductor device after the step of selectively removing at least a portion of the tensile stress layer from the at least one of the NFET devices, whereby the non-uniform nitride layer is removed during the step of removing the second set of sidewall spacers from the at least one of the PFET devices and the third set of sidewall spacers from the at least one of the NFET devices.

5. The method of claim 4, wherein the step of applying a non-uniform nitride layer comprises depositing a non-uniform nitride material across the semiconductor device.

6. The method of claim 5, wherein the step of applying a non-uniform nitride material creates a profile where the nitride material is thicker on the upper portions of the profile across the at least one of the NFET devices and the at least one of the PFET devices and thicker along the bottom portions of the profile between the at least one of the NFET devices and the at least one of the PFET devices and thinner in the middle of the profile adjacent the sidewall portions of the at least one of the NFET devices and the at least one of the PFET devices.

7. The method of claim 6, wherein the step of applying a non-uniform nitride material comprises applying a non-uniform nitride material that has a thickness ranging from about 500 Angstroms to about 750 Angstroms.

8. The method of claim 4, wherein the non-uniform nitride layer is removed with an isotropic etch process.

9. The method of claim 3, wherein the step of relaxing the compressive stress comprises implanting the compressive stress layer with a relaxation species.

10. The method of claim 9, wherein the relaxation species is a material comprised of Xenon.

11. The method of claim 10, wherein the relaxation species is a material comprised of Germanium.

12. The method of claim 2, wherein the step of depositing a compressive stress layer comprises depositing a nitride liner material having a compressive internal stress state.

13. The method of claim 12, wherein the step of depositing a compressive stress layer is performed by plasma enhanced chemical vapor deposition.

14. The method of claim 1, wherein the step of depositing a tensile stress layer comprises depositing a nitride liner material having a tensile internal stress state.

15. The method of claim 14, wherein the step of depositing a tensile stress layer is performed by plasma enhanced chemical vapor deposition.

16. The method of claim 1, further including the step of thermal cycling the semiconductor device after the step of removing at least a portion of the tensile stress layer over the at least one of the PFET devices to activate the tensile stress layer over the at least one of the NFET devices and induce a stress within the at least one of the NFET devices.

17. The method of claim 16, wherein the step of thermal cycling comprises performing a standard dopant activation anneal with a temperature in excess of about 1070 degrees Centigrade.

18. The method of claim 1, wherein the step of removing at least a portion of the tensile stress layer from the at least one of the NFET devices is performed with an anisotropic reactive ion etch.

* * * * *